(12) United States Patent
Yoon

(10) Patent No.: US 7,732,905 B2
(45) Date of Patent: Jun. 8, 2010

(54) STACK PACKAGE AND SEMICONDUCTOR MODULE IMPLEMENTING THE SAME

(75) Inventor: Tae-Sung Yoon, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 972 days.

(21) Appl. No.: 11/331,001

(22) Filed: Jan. 13, 2006

(65) Prior Publication Data

US 2007/0007645 A1 Jan. 11, 2007

(30) Foreign Application Priority Data

Jul. 6, 2005 (KR) .................... 10-2005-0060730

(51) Int. Cl.
H01L 23/02 (2006.01)
H01L 23/34 (2006.01)

(52) U.S. Cl. ................. 257/686; 257/723; 257/731; 257/750; 257/777; 257/786; 257/784; 257/778; 257/685; 361/614; 361/667; 361/735; 361/748; 361/767

(58) Field of Classification Search ................. 257/723, 257/731, 750, 776, 777, 788, 790, 686, 784, 257/778, 685, 774; 361/614, 667, 735, 748, 361/747, 767
See application file for complete search history.

(56) References Cited

U.S. PATENT DOCUMENTS 5,313,096 A 5/1994 Eide

| 5,604,377 A * | 2/1997 | Palagonia .................... 257/685 |
| 6,818,980 B1 * | 11/2004 | Pedron, Jr. ................... 257/706 |
| 7,250,675 B2 * | 7/2007 | Fasano et al. ............... 257/723 |
| 2002/0070447 A1 * | 6/2002 | Kinsman ..................... 257/723 |
| 2003/0067064 A1 * | 4/2003 | Kim ........................... 257/686 |
| 2005/0110168 A1 * | 5/2005 | Chuang ....................... 257/788 |
| 2005/0133897 A1 * | 6/2005 | Baek et al. .................. 257/686 |

FOREIGN PATENT DOCUMENTS

| JP | 11-111914 | 4/1999 |
| KR | 100256307 | 2/2000 |
| KR | 1020020002521 | 1/2002 |

* cited by examiner

Primary Examiner—Kenneth A Parker
Assistant Examiner—Joseph Nguyen
(74) Attorney, Agent, or Firm—Harness, Dickey & Pierce, P.L.C.

(57) ABSTRACT

The stack package may have a structure in which unit packages may be inserted into slots of a receiving substrate. The unit package may have a plurality of connecting pads. The receiving substrate may have substrate pads, which may be electrically connected to the connecting pads of the unit packages inserted in the slots by mechanical contact. The slots may be provided at regular vertical intervals so that the unit packages may be stacked in the vertical direction. A semiconductor module may include stack packages installed on at least one surface of a module substrate.

19 Claims, 12 Drawing Sheets

STACK PACKAGE AND SEMICONDUCTOR MODULE IMPLEMENTING THE SAME

PRIORITY STATEMENT

This U.S. non-provisional application claims benefit of priority under 35 U.S.C.§119 from Korean Patent Application No. 2005-60730, filed on Jul. 6, 2005, the entire contents of which are incorporated herein by reference.

BACKGROUND

1. Field of the Invention

Example embodiments of the present invention relate to a semiconductor device and, more particularly, to a stack package having a plurality of unit packages that may be inserted into a receiving substrate to be stacked and electrically connected to each other, and a semiconductor module that may implement the same.

2. Description of the Related Art

The electronic industry may seek to provide products having (for example) characteristics of light-weight, miniaturization, high speed, multifunction, high performance, high reliability and low production cost. Packaging may be one technology area that may enable design of such a product. One packaging technique may provide a chip scale package (CSP), which may have a size comparable to a semiconductor chip.

Various technologies may attempt to provide a greater number of cells in the limited space of a semiconductor chip to increase the capacity of a semiconductor chip, but such technologies are not without shortcomings. For example, such technologies may involve fine line-widths and/or a substantial development time. Accordingly, some approaches may attempt to increase integration by stacking semiconductor chips and/or semiconductor packages to form a stack package.

One stack package may be manufactured by stacking a plurality of semiconductor chips. However, the chip stacking techniques may suffer from a decreased yield. For example, a stack chip package may be classified as a failed product if it includes a defective semiconductor chip. Here, repair work may not be possible.

Another stack package may be manufactured by stacking a plurality of unit packages. On the one hand, the unit package stacking technique may result in a stack package that is thicker than one manufactured by stacking chips. On the other hand, yield may be improved because (for example) the quality of a unit package may be verified prior to the stacking process. Additionally, the increase in thickness may be reduced by using a chip scale package as the unit package.

FIG. 1 illustrates a conventional stack package that may implement a chip scale package as a unit package. Here, the stack package 10 may include a stack of four unit packages 20.

Each of the unit package 20 may be a chip scale package. A semiconductor chip 24 may be mounted on the upper surface of a substrate 22. Conductive bumps 26 may be provided on the lower surface of the substrate 22. Connecting pads 28 may be provided on the upper surface of the substrate 22. The connecting pads 28 may be located over the conductive bumps 26. Electrical connections between the semiconductor chip 24 and the substrate 22 may be sealed with a molding resin (not shown). The molding resin may be selected from the epoxy family, for example.

Stacking the unit packages 20 may involve mounting an upper unit package on a lower unit package, and applying heat to melt the conductive bumps 26. When melted and then cooled, the conductive bumps 26 of an upper unit package may be fixed to the connecting pads 28 of a lower unit package. This stacking process (inclusive of the heat application technique) may be repeated to complete the stack package 10.

Heat over 200° C. may be applied to melt the conductive bumps 26. The application of heat may cause thermal stresses in the components of the stack package 10. Such thermal stresses may damage the components.

For example, thermal stresses may cause defects, such as splitting of conductive bumps and/or short circuits between adjacent conductive bumps. Package defects may occur more frequently as the number of unit packages in the stack increases.

Additionally, components of a stack package such as substrates, molding resin, and semiconductor chips may have different coefficients of thermal expansion. Thus, during processes that may involve the application of heat (e.g., the stacking of unit packages), substrate warpage may occur. Substrate warpage may cause defects. For example, conductive bumps may become disconnected from a lower substrate.

A stack package may be subjected to test processes that may include (for example) an appearance inspection. A stack package identified as incorrectly assembled and/or including a defective unit package may be repaired by a process that may involve re-assembly of the stack package. If the stack package is identified as including a defective unit package, then the repair process may involve replacing the defective unit package with another unit package. In the repair process, heat may be applied to the defective unit package, as well as other component parts of the stack package. Accordingly, the repair process may cause the aforementioned defects.

In addition, the unit package may have a structure that exposes a semiconductor chip. Thus, the semiconductor chip may be susceptible to damage from external forces.

By way of example only, the stack package may be installed on a motherboard or, as shown in FIG. 2, on a module substrate 60 as a component part of a semiconductor module 50. The stack packages 10 may be installed on both sides of the module substrate 60.

The semiconductor module 50 may suffer from thermal stresses as described above, because the stack packages 10 may be installed on the module substrate 60 by a process that may involve the application of heat.

SUMMARY

According to an example, non-limiting embodiment, a package may include a receiving substrate having slots provided at vertical intervals. Substrate pads may be provided on a wall of the slots. A unit package may have a plurality of connecting pads provided on one surface. The unit package may be horizontally inserted into the slots, such that the connecting pads may be electrically connected to the substrate pads by mechanical contact.

According to another example, non-limiting embodiment, a package may include a receiving substrate having a slot. A substrate pad may be provided on a wall of the slot. A unit package may have a connecting pad. The unit package may be inserted into the slot, such that the connecting pad may be electrically connected to the substrate pad by a friction, non-fused contact.

The drawings are provided for illustrative purposes only and are not drawn to scale. The spatial relationships and relative sizing of the elements illustrated in the various embodiments may be reduced, expanded and/or rearranged to improve the clarity of the figure with respect to the corresponding description. The figures, therefore, should not be interpreted as accurately reflecting the relative sizing or positioning of the corresponding structural elements that could be encompassed by an actual device manufactured according to the example embodiments of the invention.

DETAILED DESCRIPTION OF EXAMPLE, NON-LIMITING EMBODIMENTS

Example, non-limiting embodiments of the present invention will be described in detail with reference to the accompanying drawings. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

An element is considered as being mounted (or provided) "on" another element when mounted or provided) either directly on the referenced element or mounted (or provided) on other elements overlaying the referenced element. Throughout this disclosure, spatial terms such as "upper," "lower," "above" and "below" (for example) are used for convenience in describing various elements or portions or regions of the elements as shown in the figures. These terms do not, however, require that the structure be maintained in any particular orientation.

Figure 1:
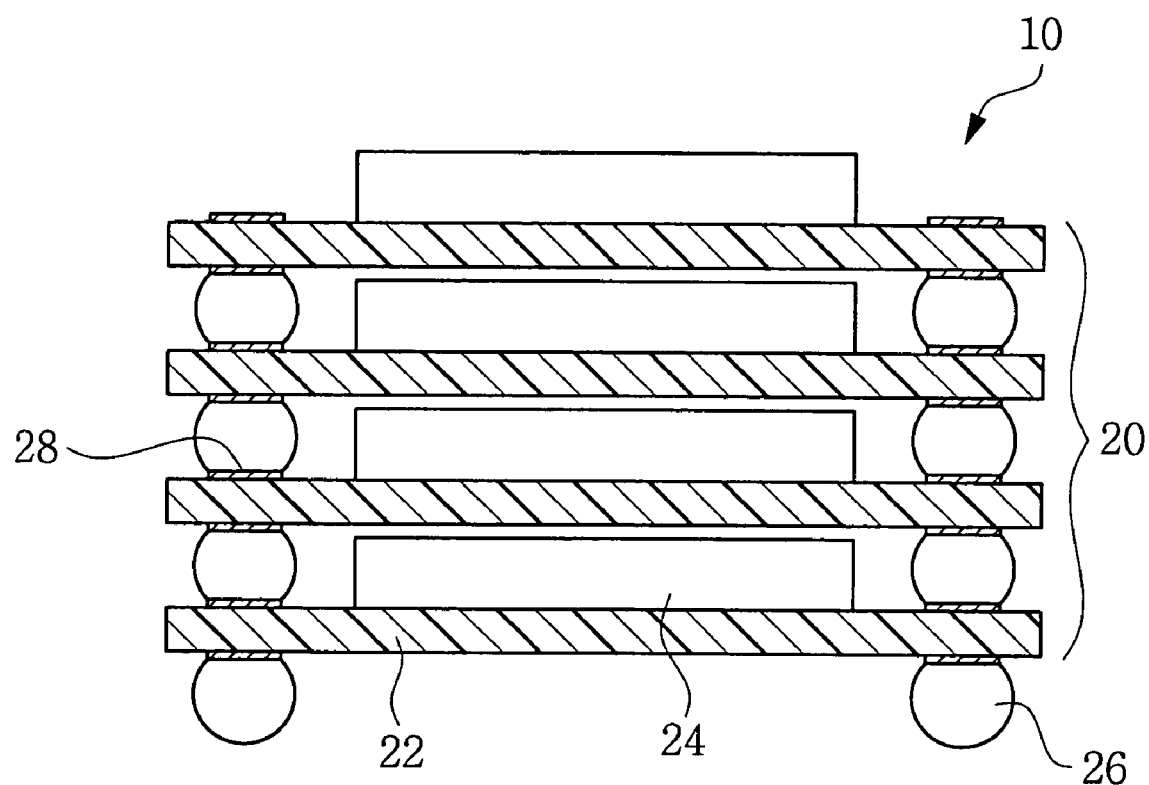
FIG. 1 is a cross sectional view of a conventional stack package.
Figure 2:
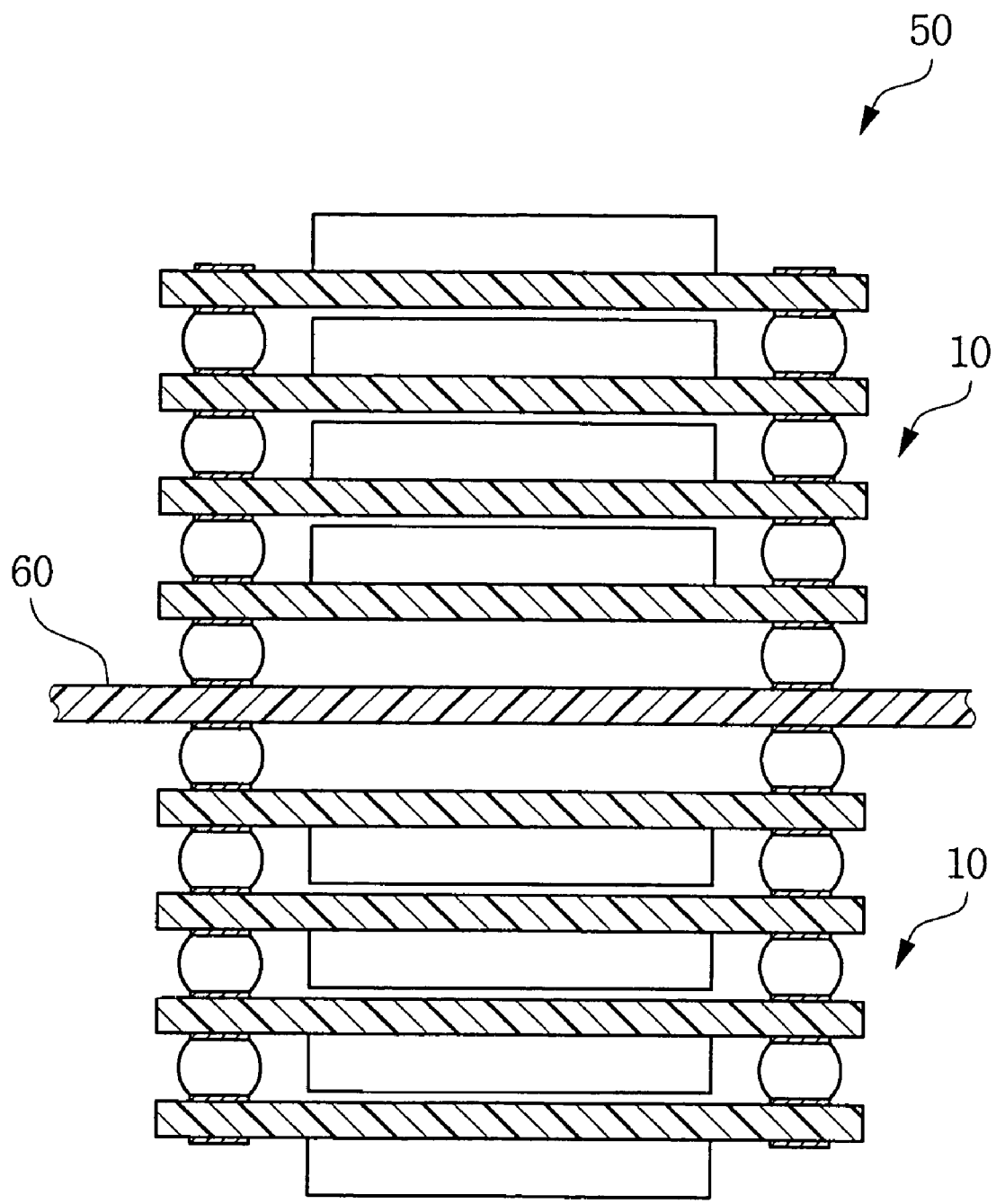
FIG. 2 is a cross sectional view of a semiconductor module that may implement the conventional stack package of FIG. 1.
Figure 3:
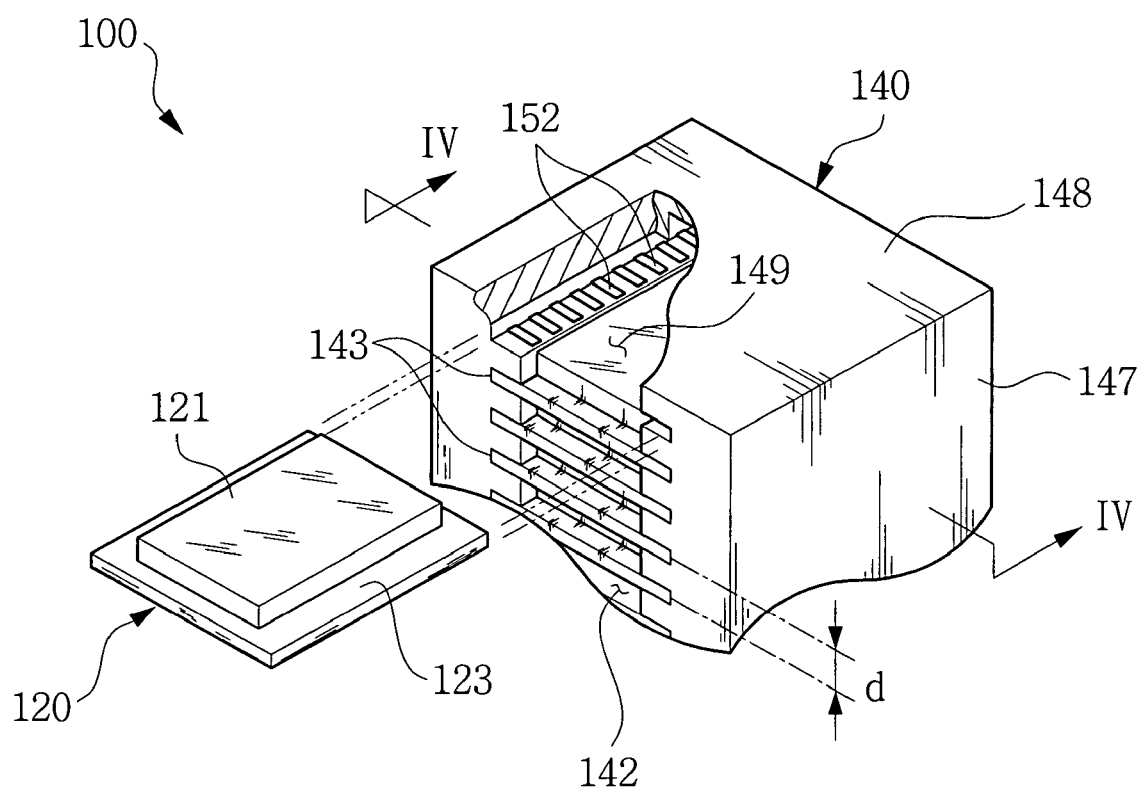
FIG. 3 is an exploded perspective view of a stack package according to an example embodiment of the present invention.
Figure 4:
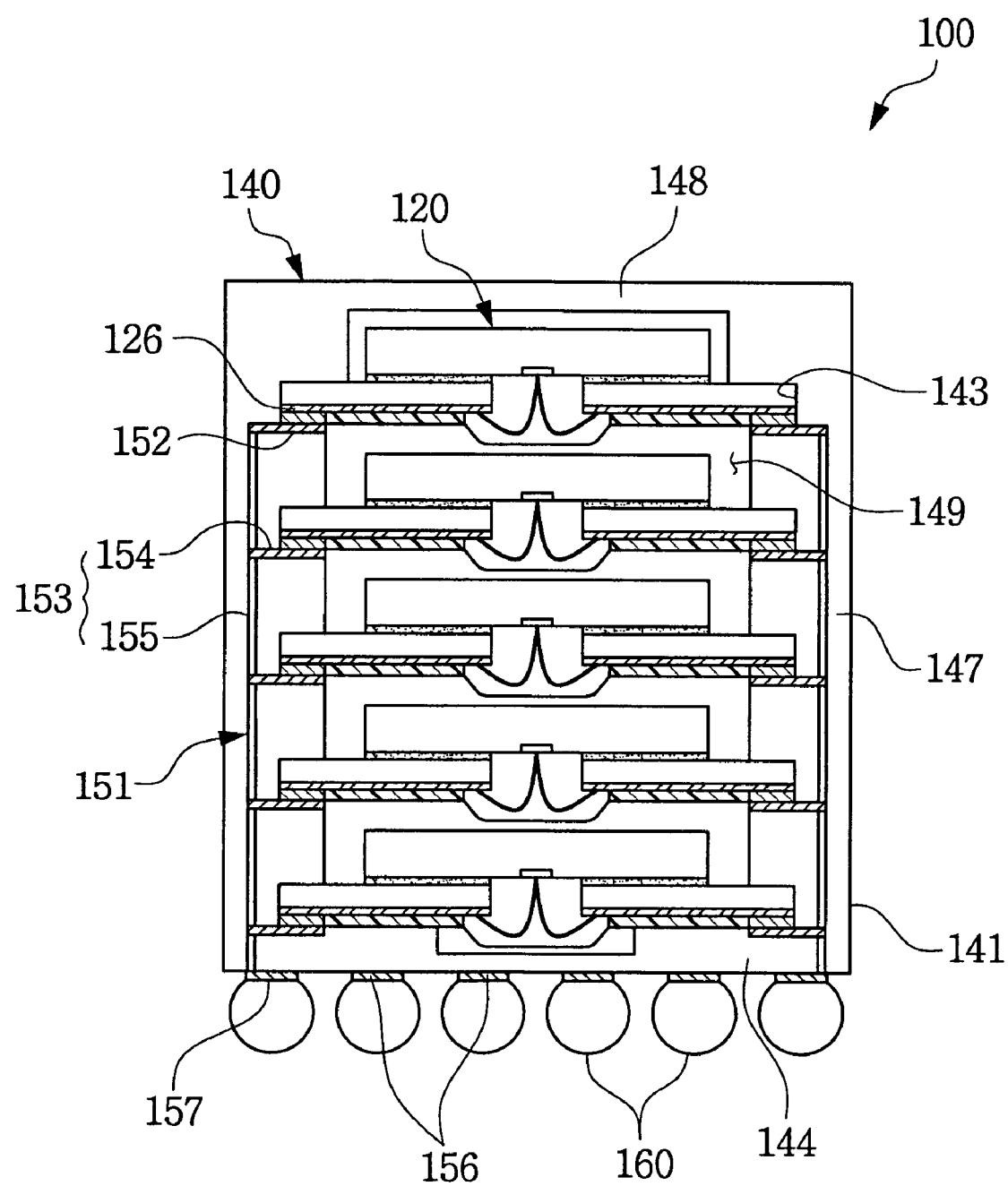
FIG. 4 is a cross sectional view taken along the line IV-IV of FIG. 3.
Figure 5:
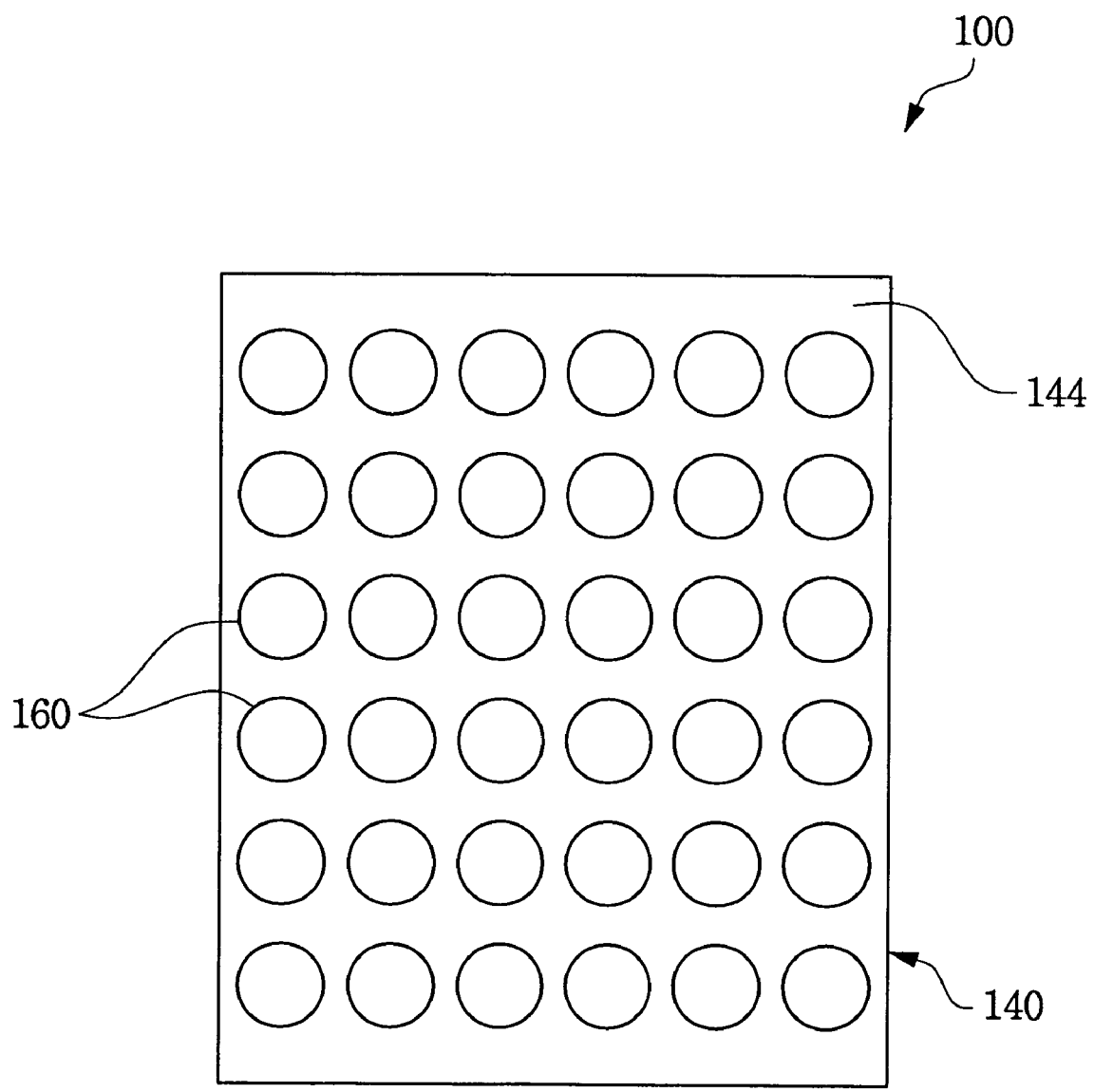
FIG. 5 is a plan view of a surface of the receiving substrate of FIG. 4.

FIG. 3 is an exploded perspective view of a stack package 100 according to an example embodiment of the present invention. FIG. 4 is a cross sectional view taken along the line IV-IV of FIG. 3. FIG. 5 is a plan view showing a surface of the receiving substrate of FIG. 4.

Referring to FIGS. 3 to 5, the stack package 100 may include a receiving substrate 140 that may have a plurality of slots 143. By way of example only, the slots 143 may be arranged vertically in the receiving substrate 140. A plurality of unit packages 120 may be inserted into the slots 143 of the receiving substrate 140. By way of example only, the unit packages 120 may be horizontally oriented. The unit packages 120 may be electrically connected to each other by mechanical contact through the receiving substrate 140. By way of example only, the mechanical contact (that may provide an electrical connection) between the unit package 120 and the receiving substrate 140 may be a friction, non-fused contact. Conductive bumps 160 may be provided on the lower surface of the receiving substrate 140.

The unit packages 120 may be stacked and electrically connected without the application of heat (and the associated thermal stress), because the unit packages 120 may be inserted into the slots 143 of the receiving substrate 140 and electrically connected by mechanical contact. Also, a repair process may be performed without the application of heat (and the associated thermal stress), because a defective unit package 120 may be individually removed from the slot 143. Additionally, damage to the unit package 120 by external force may be avoided, because the receiving substrate 140 may protect the unit package 120 inserted in the slot 143.

Figure 6:
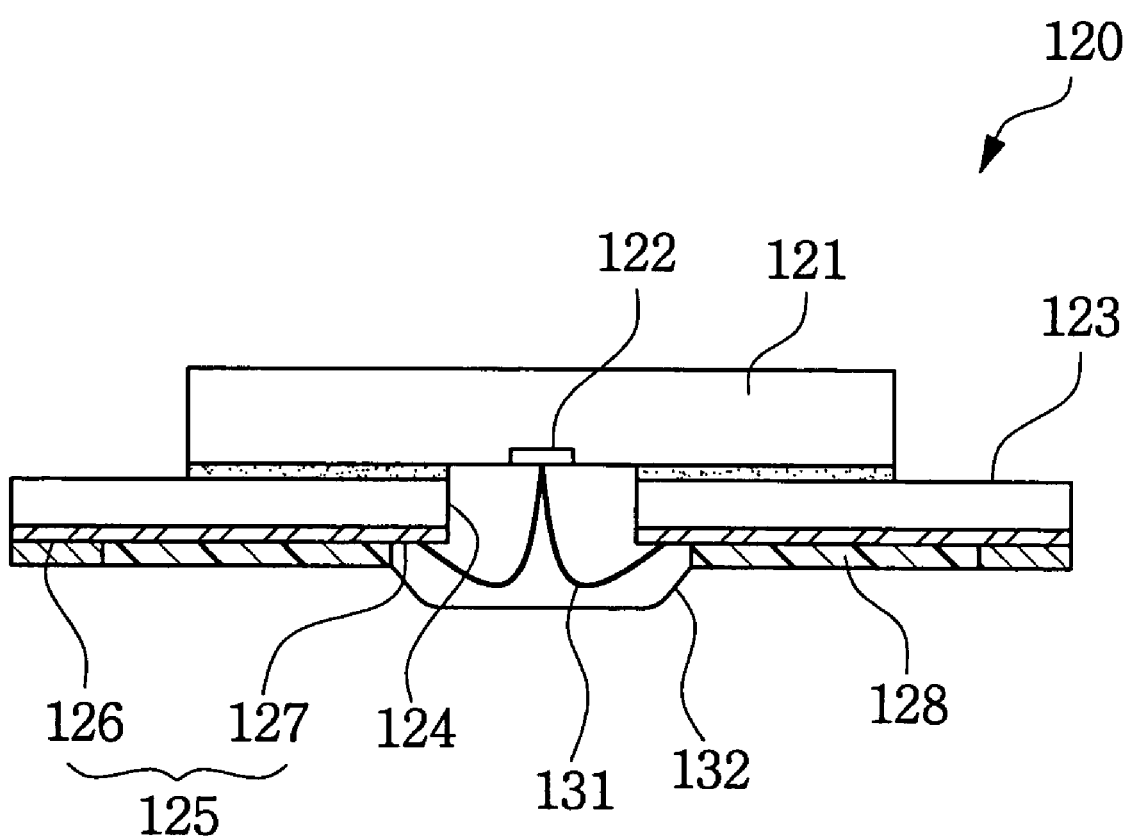
FIG. 6 is an enlarged cross sectional view of the unit package of FIG. 4.
Figure 7:
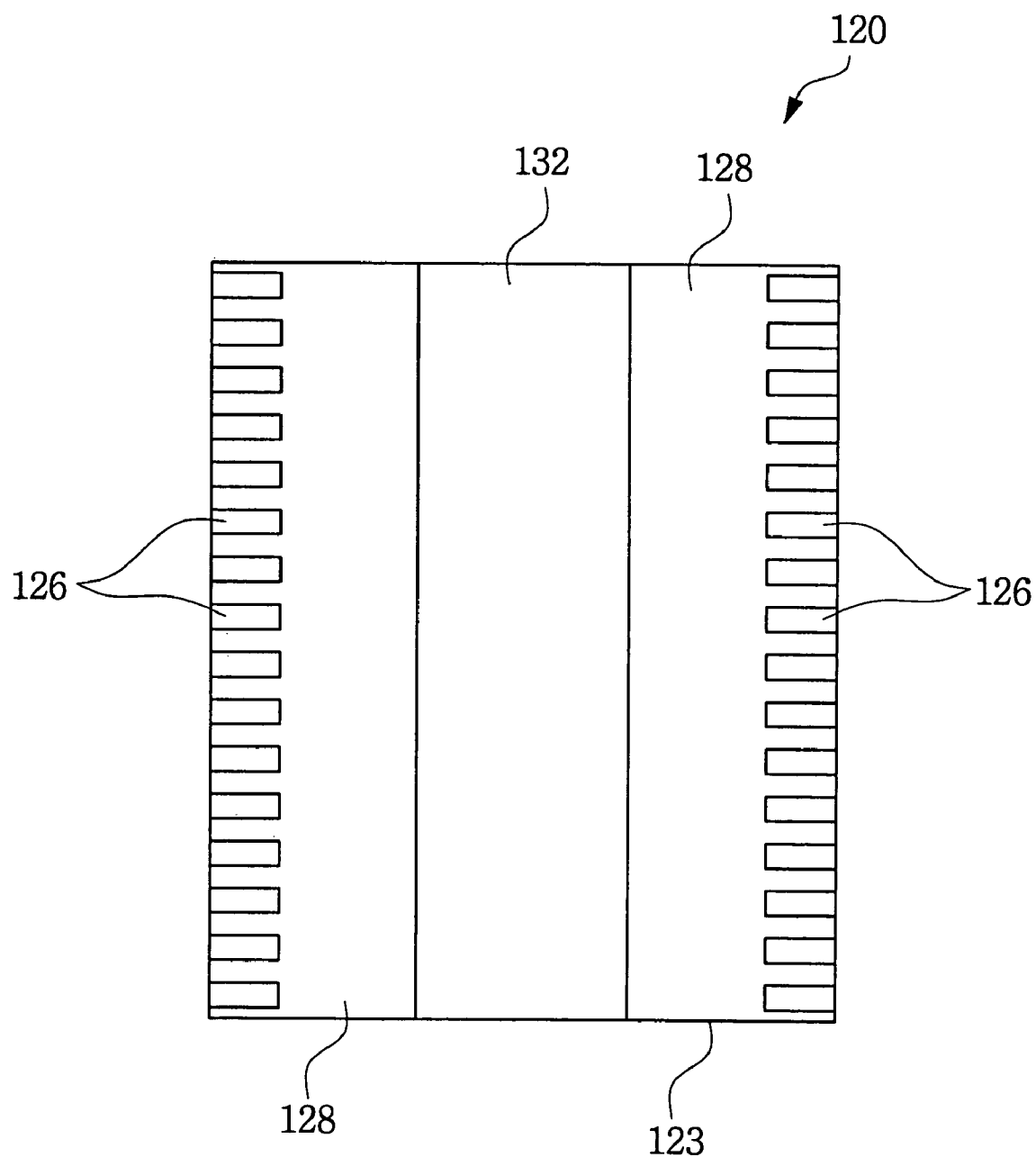
FIG. 7 is a plan view of a surface of the unit package of FIG. 4.

As shown in FIGS. 6 and 7, the unit package 120 may be a semiconductor package having a wiring substrate 123. The wiring substrate 123 may have a lower surface supporting a plurality of connecting pads 126. A semiconductor chip 121 may be provided on the upper surface of the wiring substrate 123. Conductive bumps may not be provided on the connecting pads 126. By way of example only, the lower surface of the connecting pad 126 may be substantially flush with the lower surface of the wiring substrate 123.

The semiconductor chip 121 may have an active surface supporting chip pads 122. By way of example only, the chip pads 122 may be arranged in the center region of the active surface.

The wiring substrate 123 may have a window 124 through which the chip pads 122 of the semiconductor chip 121 may be exposed. A wiring pattern 125 may be disposed on the lower surface of the wiring substrate 123. The wiring pattern 125 may include bonding pads 127 and the connecting pads 126. The connecting pads 126 may be individually connected to the bonding pads 127. The connecting pads 126 may be provided in rows that may extend along opposite sides of the window 124 and parallel to the lengthwise direction of the window 124. The wiring pattern 125 excluding the bonding pads 127 and the connecting pads 126 may be covered by a solder mask 128, for example. The surface of the connecting pads 126 may be coated with a metal. The surface of the metal coating may be substantially flush with the surface of the solder mask 128.

The active surface of the semiconductor chip 121 may be fixed to the upper surface of the wiring substrate 123, so that the chip pads 122 may be exposed through the window 124. The connecting pads 126 may be located on a region of the wiring substrate 123 that is outside of the semiconductor chip mounting region of the wiring substrate 123. That is, the semiconductor chip 121 may not be superposed above the connecting pads 126.

The chip pads 122 of the semiconductor chip 121 and the bonding pads 127 of the wiring pattern 125 may be electrically connected together by bonding wires 131 that may extend through the window 124.

The chip pads 122 of the semiconductor chip 121, the bonding wires 131, the bonding pads 127 and the window 124 may be covered by a resin sealing 132. The resin sealing 132 may be fabricated from a molding resin.

The wiring substrate 123 may be a printed circuit board, for example.

As shown in FIGS. 3 to 5, and by way of example only, the slots 143 may be provided in the receiving substrate 140 at regular vertical intervals. Edges of the unit package 120 may be inserted in the horizontal direction into the slots 143, so that substrate pads 152 (of the receiving substrate 140) may be connected electrically to the connecting pads 126 of the unit package 120. The electrical connection between the receiving substrate and the unit package 120 is achieved by a mechanical contact. For example, the mechanical contact between the substrate pads 152 and the connecting pads 126 may be a friction, non-fused contact.

The receiving substrate 140 may be a multi-layer printed circuit board having a structure in which unit substrates may be stacked together. The unit substrates may have a circuit wiring layer formed on an insulating plate of prepreg, for example. By way of example only, a circuit wiring layer 151 may be formed by thermo-compressing a copper foil onto an insulating plate and patterning the copper foil.

In this example embodiment, the receiving substrate 140 may have a rectangular box shape. The receiving substrate 140 may include a loading space 149 that may extend to openings 142 at opposite sides of a substrate body 141. The slots 143 may be provided in the substrate body 141 and may face toward the loading space 149. Slots 143 may confront each other. The circuit wiring layers 151 may be provided in the substrate body 141. The circuit wiring layers 151 may include the substrate pads 152 provided along walls of the slots 143, terminal pads 156 provided on the lower surface of the substrate body 141, and inner wiring layers 153 embedded in the substrate body 141 and electrically connecting the substrate pads 152 to the terminal pads 156.

The substrate body 141 may have a structure in which a pair of second substrate bodies 147 may be provided on edge portions of the upper surface of a first substrate body 144. A third substrate body 148 may be provided on the pair of second substrate bodies 147. The first substrate body 144 may include a lower wiring layer 157 having terminal pads 156. The second substrate bodies 147 may be stacked facing each other on the first substrate body 144, and the slots 143 may be provided on the confronting surfaces of the second substrate bodies 147. The slots 143 may be parallel to the upper surface of the first substrate body 144. The third substrate body 148 may be stacked on the second substrate bodies 147.

The inner wiring layer 153 may include a connecting pattern 154 extended from the substrate pad 152 to the inside of the second substrate body 147, and a via 155 connecting the corresponding connecting patterns 154 to each other and further connecting to the lower wiring layer 157 of the first substrate body 144. The via 155 may be connected to the terminal pad 156 through the lower wiring layer 157.

In this example embodiment, the via 155 may penetrate the connecting patterns 154 and electrically connect the connecting patterns 154 to each other. In alternative embodiments, a substrate pad and a terminal pad may be electrically connected together by vias connecting vertically adjacent connecting patterns at alternative locations and by electrically connecting the vias by connection wiring.

A distance d between adjacent slots 143 may be greater than the thickness of the unit package 120, so that the unit packages 120 inserted in the slots 143 would not mechanically interfere with each other.

A unit package of a conventional stack package may have connecting pads provided on the upper and lower surfaces of a wiring substrate to provide electrical connection between upper and lower unit packages. In the stack package 100 according to the example embodiment of the present invention, the unit package 120 may have connecting pads 126 on only one surface of the wiring substrate 123, because the receiving substrate 140 may provide electrical connection between the stacked unit packages 120 inserted therein.

The conductive bumps 160 may be provided on the terminal pads 156 of the first substrate body 144. The conductive bump 160 may be provided before or after inserting a unit package 120 in a slot 143.

The conductive bumps 160 may be provided on the entire lower surface of the first substrate body 144. Accordingly, stress that may be applied to the stack package 100 when the stack package 100 is mounted on a motherboard or module substrate (for example) may be evenly distributed through the package. The conductive bump 160 may be fabricated from solder, gold (Au) and/or nickel (Ni).

Figure 8:
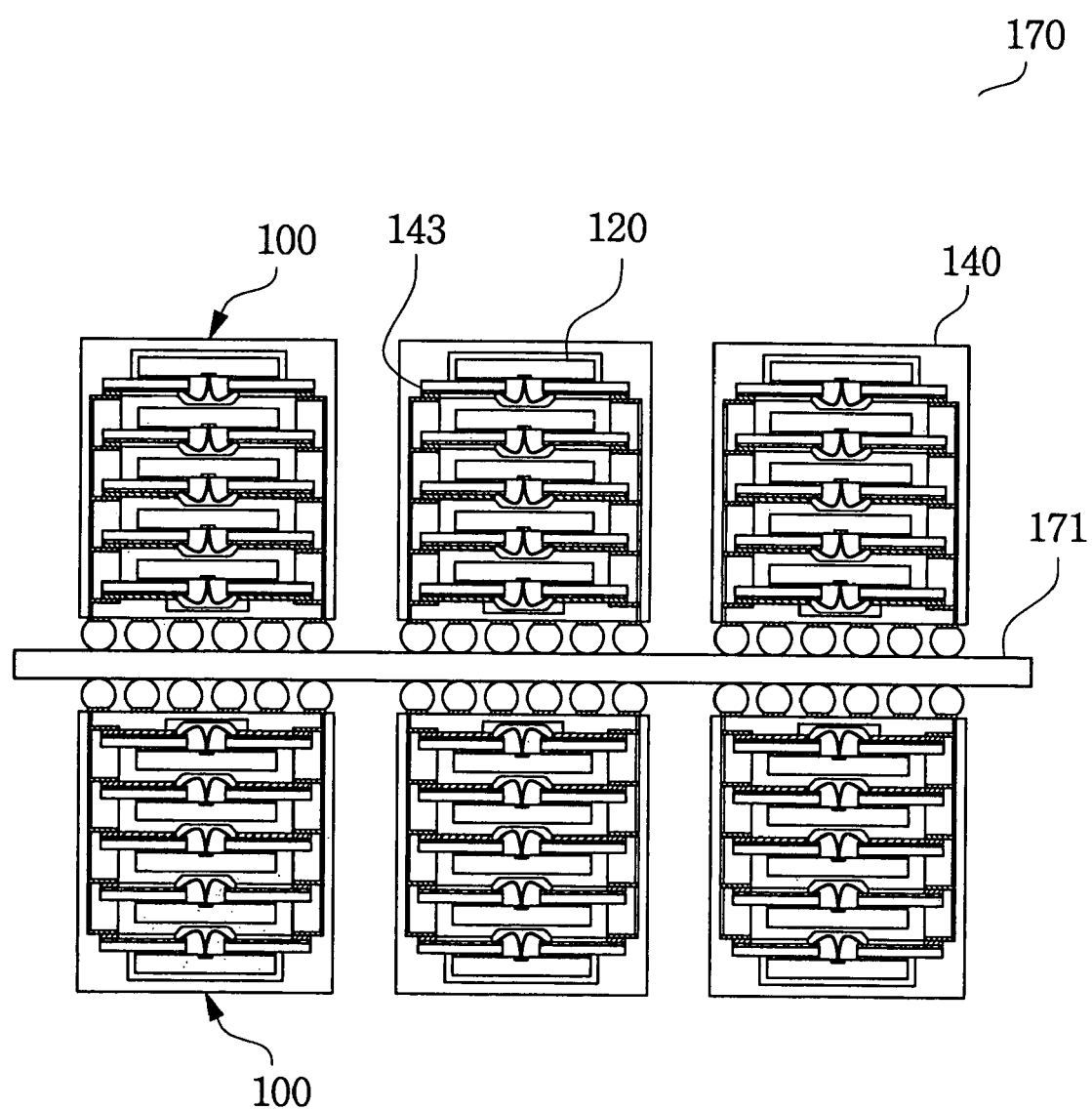
FIG. 8 is a cross sectional view of a semiconductor module that may implement the stack package of FIG. 3, according to another example embodiment of the present invention.

The stack package 100 may be mounted on a motherboard or, as shown in FIG. 8, on a module substrate 171 as a component of a semiconductor module 170. As shown in FIG. 8, the semiconductor module 170 may have a structure in which the stack packages 100 may be mounted on both sides of the module substrate 171 by conductive bumps 160.

Individual unit packages 120 may be removed from the slots 143 of the receiving substrate 140 mounted on the module substrate 171, because the unit packages 120 may be mechanically inserted into the slots 143 of the receiving substrate 140, and because the connections between the unit packages 120 and the receiving substrate 140 may not include any fused connections.

Accordingly, if the stack package 100 is installed on the module substrate 171, a repair process may be performed by removing a defective unit package from the slots 143 of the receiving substrate 140 and inserting a new unit package therein. The repair process of the unit package 120 may be performed without the application of heat (and the associated thermal stress) that may be experienced in repairing the conventional package.

Damage to the unit package 120 by external force may be reduced, because the unit package 120 may be protected by the receiving substrate 140.

Stress such as compression force (for example) applied when the stack package 100 is mounted on the module substrate 171 may be evenly distributed over the stack package, because the conductive bumps 160 may be uniformly distributed over lower surface of the stack package 100. Defect rates in a reliability test of semiconductor modules 170 after the manufacturing process may be decreased, because the stack package 100 may be fixed on the module substrate 171 through the conductive bumps 160 that may be uniformly distributed on the stack package 100.

The semiconductor module 170 may be manufactured by mounting stack packages 100 on a module substrate 171 and/or by inserting unit packages 120 into slots 143 of a receiving substrate 140 after mounting the receiving substrate 140 on the module substrate 171.

As shown in FIG. 8, stack packages 100 may be mounted on both sides of the module substrate 171 to fabricate the semiconductor module 170. In alternative embodiments, a single-sided module may be fabricated by mounting stack packages on only one side of a module substrate.

Figure 9:
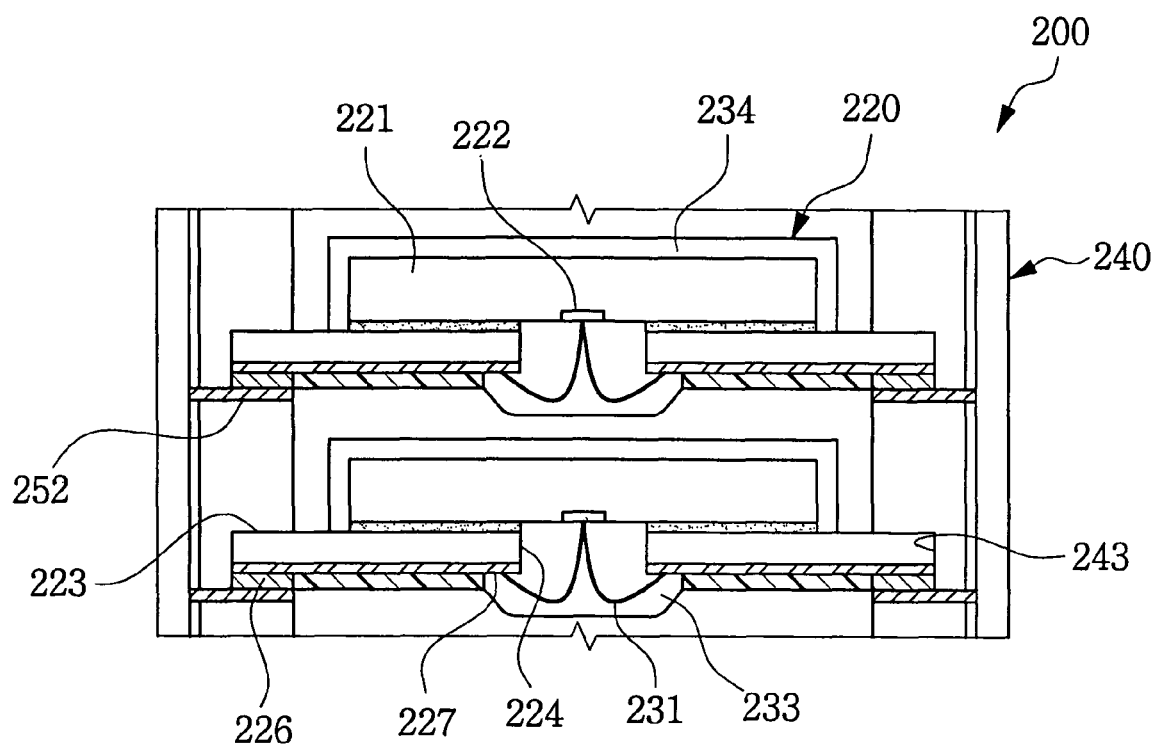
FIG. 9 is a partial cross sectional view of a stack package according to anther example embodiment of the present invention.

FIG. 9 is a partial cross sectional view of a stack package 200 according to another example embodiment of the present invention. Referring to FIG. 9, the stack package 200 may have the same structure as the first example embodiment to the extent that unit packages 220 may be stacked by inserting them into slots 243 of a receiving substrate 240. However, there are differences in the configuration of the unit packages 220.

The unit package 220 may include a resin sealing 234 (referred to as a second resin sealing) that may seal a semiconductor chip 221 mounted on the upper surface of a wiring substrate 223. The second resin sealing 234 may be fabricated from molding resin. The second resin sealing 234 may seal the region of the wiring substrate 223 where the semiconductor chip 221 is mounted, but may not extend to a region of the wiring substrate 223 located above the connecting pads 226. The chip pads 222 of the semiconductor chip 221, the bonding wires 231, and the bonding pads 227, which may be exposed through a window 224, may be sealed by a resin sealing 233 (referred to as a first resin sealing). The first resin sealing 233 may be fabricated from molding resin.

When inserting the unit packages 220 into the slots 243 of the receiving substrate 240, an edge portion of the wiring substrate 223 that may support the connecting pads 226 (but not the second resin sealing 234) may be inserted into the slot 243 of the receiving substrate 240. Since two edge portions of the wiring substrate 223 may be inserted into the slot 243 and electrically connected by mechanical contact, the wiring substrate 223 may be fabricated from a hard material, such as a printed circuit board (for example).

The first resin sealing 233 and the second resin sealing 234 may be formed by a single molding process or by individual molding processes.

The stack package 200 may be mounted directly on a motherboard or on a module substrate to provide a semiconductor module.

In this example embodiment, the stack package 200 may have a structure in which the second resin sealing may seal the semiconductor chip installation portion of the upper surface of the wiring substrate with molding resin. Alternatively, as shown in FIG. 10, a second resin sealing 334 may seal the entire upper surface of a wiring substrate 323 with molding resin.

Figure 10:
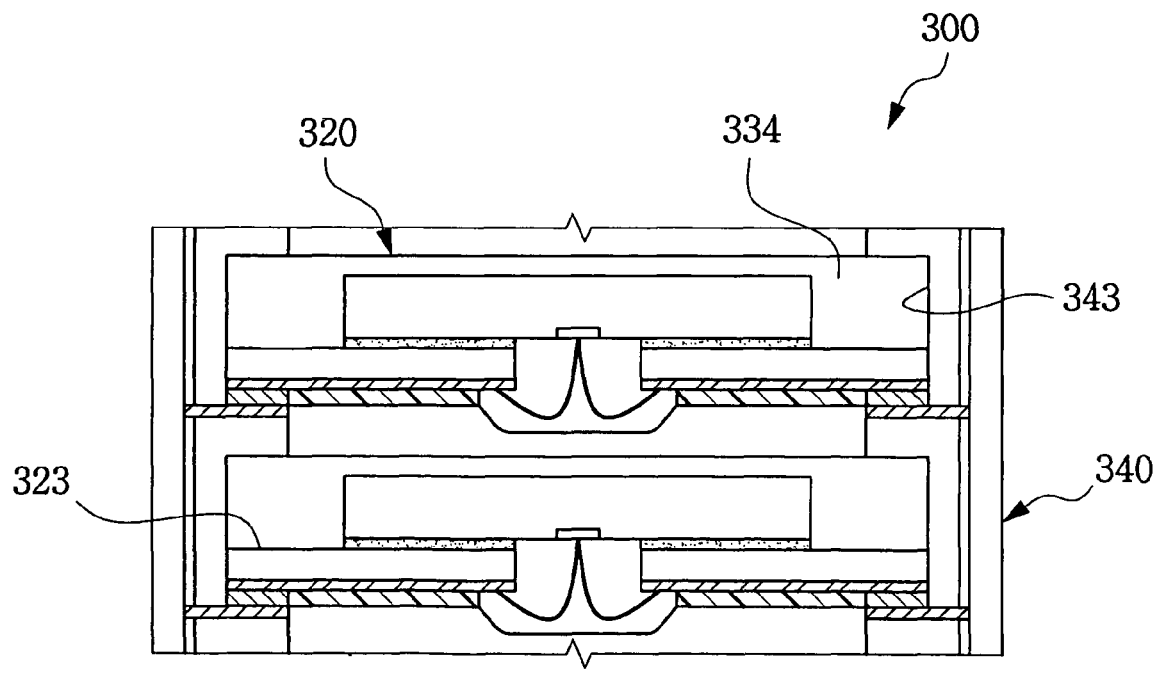
FIG. 10 is a partial cross sectional view of a stack package according to another example embodiment of the present invention.

Referring to FIG. 10, a stack package 300 according to another example embodiment may have a structure in which edge portions of a unit package 320, which may include the wiring substrates 323 and the second resin sealing 334, may be inserted into slots 343 of a receiving substrate 340.

The wiring substrate 323 may be a printed circuit board or a flexible tape wiring substrate, for example. The second resin sealing 334 provided on the upper surface of the wiring substrate 323 may reinforces the strength of the wiring substrate 323

Figure 12:
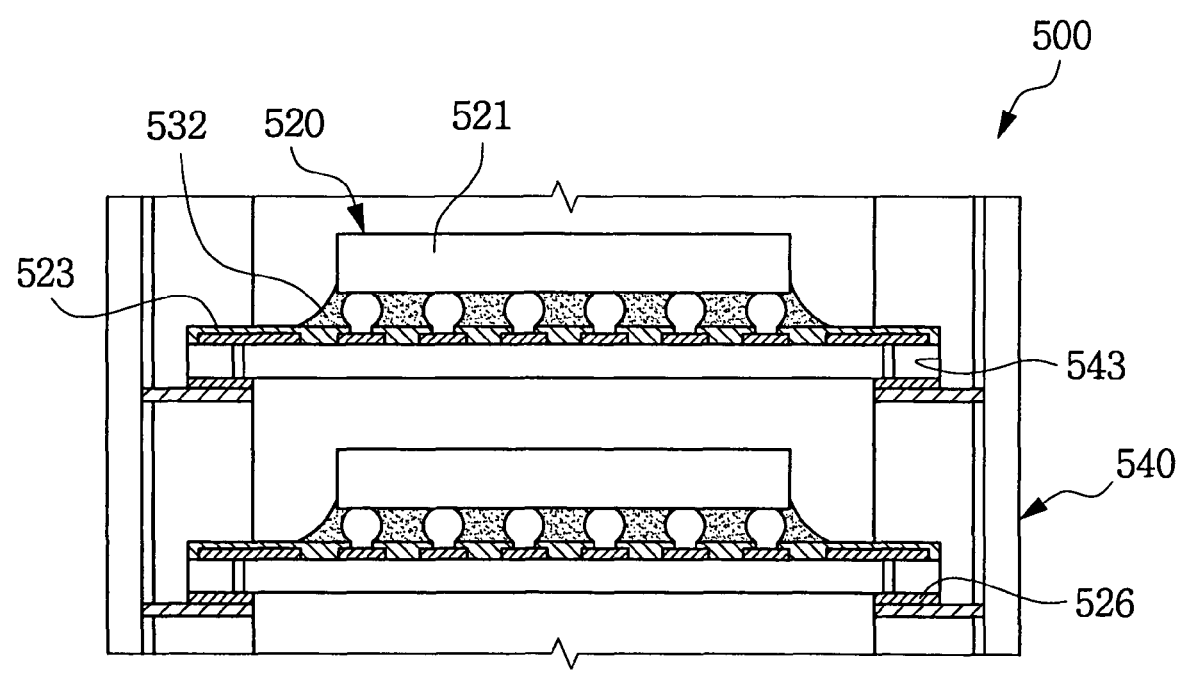
FIG. 12 is a partial cross sectional view of a stack package according to another example embodiment of the present invention.
Figure 13:
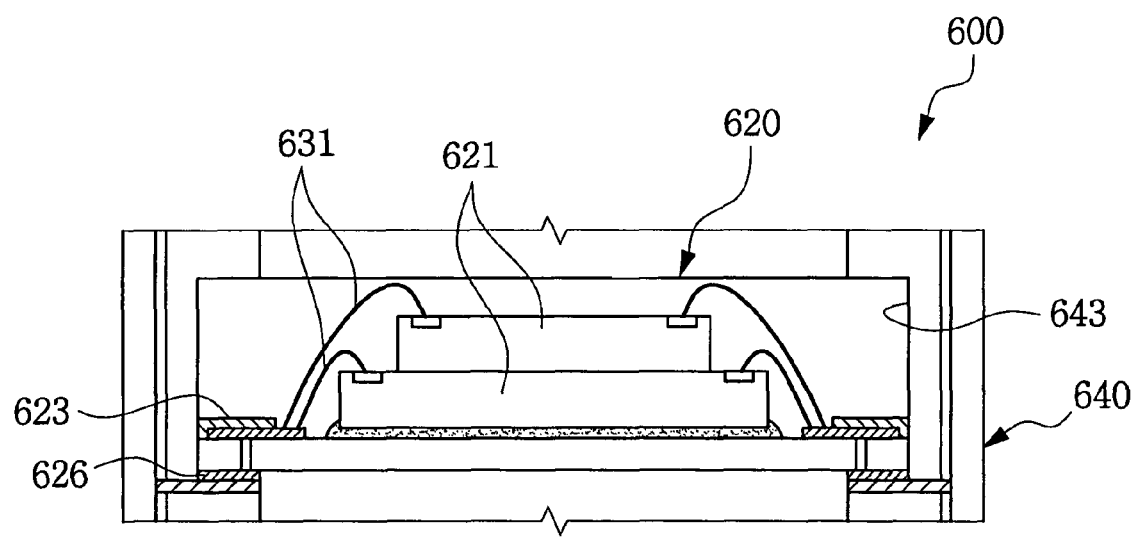
FIG. 13 is a partial cross sectional view of a stack package according to another example embodiment of the present invention.

In the previous example embodiments, the unit package may have a structure in which chip pads, which may be exposed through a window of a wiring substrate, may be electrically connected to bonding pads that may be provided on the lower surface of a wiring substrate by bonding wires. In alternative embodiments, as shown in FIGS. 11 to 13, a unit package may have at least one semiconductor chip mounted on the upper surface of the wiring substrate and electrical connections between the semiconductor chip and the wiring substrate may be provided on the upper surface of the wiring substrate.

Figure 11:
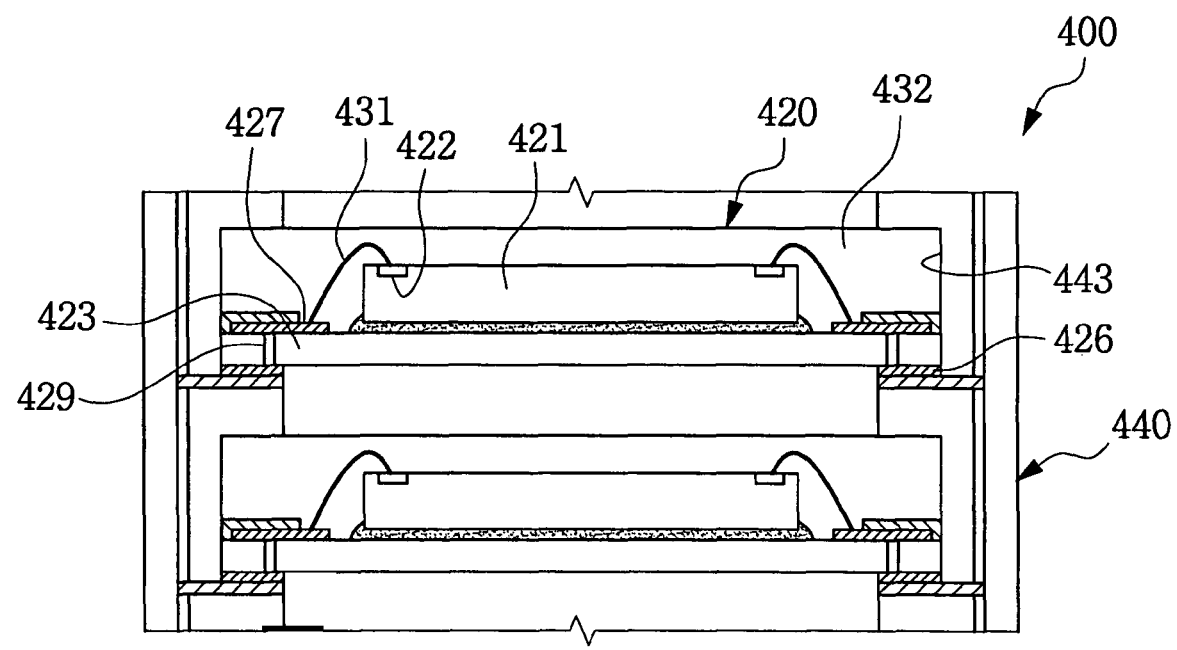
FIG. 11 is a partial cross sectional view of a stack package according to another example embodiment of the present invention.

FIG. 11 is a partial cross sectional view of a stack package 400 according to another example embodiment of the present invention. Referring to FIG. 11, the stack package 400 may implement a unit package 420 in which the back side of a semiconductor chip 421 confronts the upper surface of a wiring substrate 423.

The semiconductor chip 421 may have chip pads 422 on the edges portion of an active surface. The back side of the semiconductor chip 421 may confront the upper surface of the wiring substrate 423. Bonding pads 427 may be provided on the upper surface of the wiring substrate 423. The bonding pads 427 may be electrically connected to the chip pads 422 of the semiconductor chip 421 by bonding wires 431. The semiconductor chip 421 and the bonding wires 431 may be covered by a resin sealing 432, which may be fabricated from a molding resin. The bonding pads 427 on the upper surface of the wiring substrate 423 may be electrically connected to connecting pads 426 on the lower surface of the wiring substrate 423 by a via 429, which may pierce the wiring substrate 423.

The resin sealing 432 may seal the entire upper surface of the wiring substrate 423, and the wiring substrate 423 and the resin sealing 432 may be inserted into the slots 443 of the receiving substrate 440.

In this example embodiment, the unit package may include a semiconductor chip the may be electrically connected to a wiring substrate by wire bonding. In alternative embodiments, as shown in FIG. 12, a unit package 520 may have a semiconductor chip 521 that may be flip chip bonded to a wiring substrate 523.

Referring to FIG. 12, a stack package 500 may include the unit packages 520, which may have the semiconductor chip 521 flip chip bonded to the upper surface of the wiring substrate 523, inserted into slots 543 of a receiving substrate 540.

A gap between the semiconductor chip 521 and the wiring substrate 523 may be provided with a filler 532, which may be formed by an under-fill method (for example). Connecting pads 526 may be provided on the lower surface of the wiring substrate 523.

The stack package 500 may have a structure in which the portion of the wiring substrate 523 outside the semiconductor chip 521 may be inserted into the slots 543 of the receiving substrate 540.

In the previous example embodiment, the unit packages may implement a single semiconductor chip. However, a multiple chip package having a plurality of semiconductor chips may be implemented.

A stack package 600 according to another example embodiment may have a structure in which a unit package 620, which may have two semiconductor chips 621 stacked on the upper surface of a wiring substrate 623, may be inserted into slots 643 of a receiving substrate, as shown in FIG. 13.

The unit package 620 may have the semiconductor chips 621 stacked on the upper surface of the wiring substrate 623, and the semiconductor chips 621 and the wiring substrate 623 may be electrically connected by bonding wires 631. The bonding wires 631 may be covered by a resin sealing 632, which may be fabricated from molding resin, for example. Connecting pads 626 may be provided on the lower surface of the wiring substrate 623.

The stack package 600 according to the sixth example embodiment may have a structure that is somewhat similar to that of the stack package according to the fourth example embodiment.

All of the previous embodiments may suitably implement a unit package, which may have connecting pads arranged in rows at one or more edge portions, so that the unit package may be inserted into a slot of a receiving substrate.

The previous embodiments of the present invention may include unit packages of the same type that may be inserted into a receiving substrate. In alternative embodiments, a stack package may include unit packages of more than one type that may be inserted into a receiving substrate. For example, different types of unit package may be inserted into a receiving substrate by adjusting the slot width of the cabinet substrate and/or the distance between the slots.

In the previous example embodiments, various types of unit package may be inserted into slots of a receiving substrate and conductive bumps may be provided on the lower surface of the receiving substrate. Accordingly, the stack packages may be installed via conventional mounting techniques.

Figure 14:
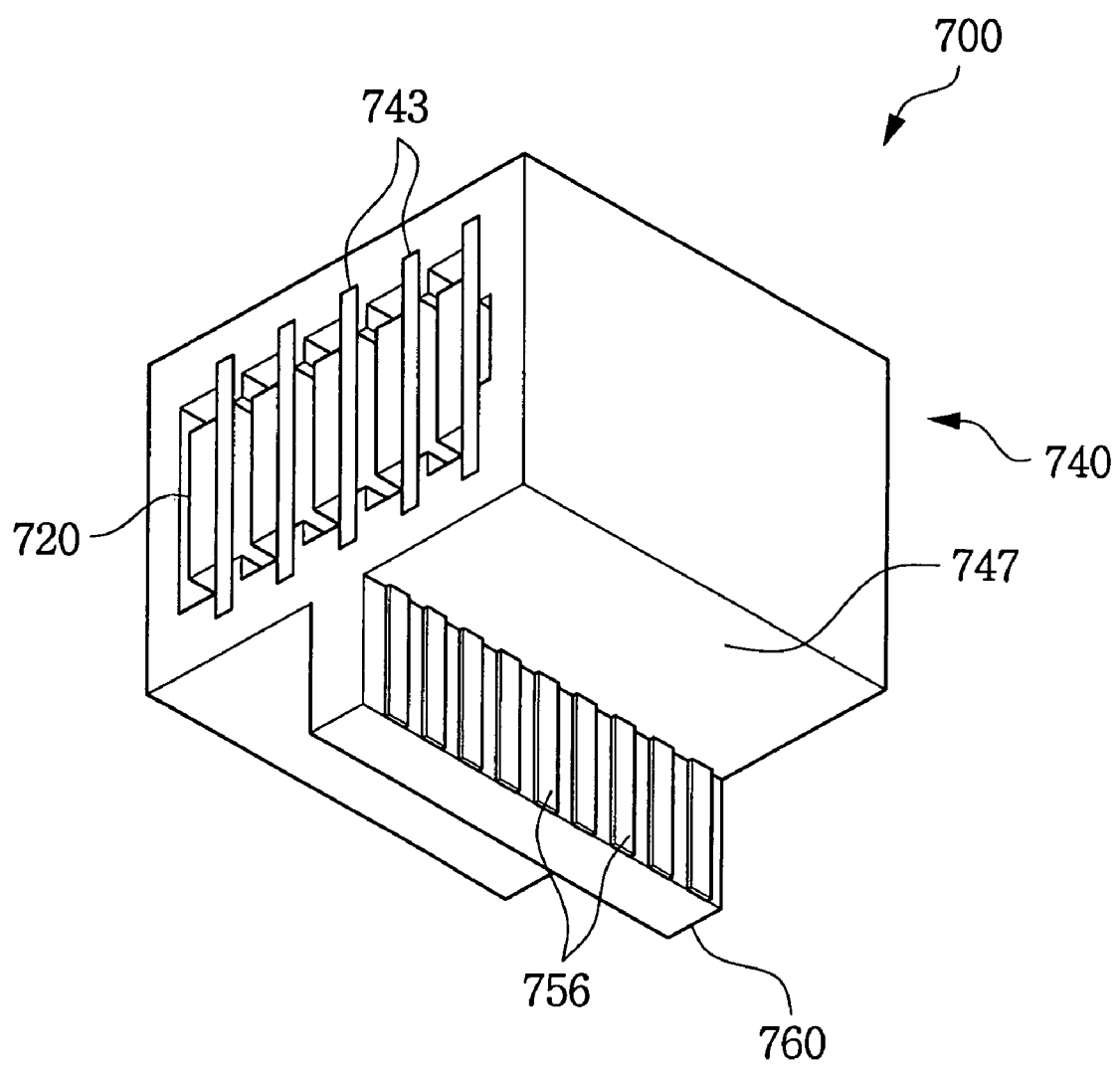
FIG. 14 is a partial cross sectional view of a stack package according to another example embodiment of the present invention.

A connector may be implemented as an external connection terminal for a stack package. As shown in FIG. 14, a stack package 700 according to another example embodiment may have a structure in which unit packages 720 may be inserted into slots 743 of a receiving substrate 740 and a connector 760 may protrude from an outer surface of the receiving substrate 740. The structure in which the unit packages 720 may be inserted into the slots 743 of the receiving substrate may be the same as the structures disclosed in the previous example embodiments, and therefore a detailed explanation of the same is omitted.

The connector 760 may be provided on the outer surface of a second substrate body 747. The connector 760 may be parallel to the direction in which the slot 743 extend. Terminal pads 756, which may be electrically connected to a socket (not shown), may be provided at intervals (e.g., regular intervals) along the outer surface of the connector 760. The connector 760 may be provided in the center of the second substrate body 747 to maintain weight balance of the receiving substrate 740. In alternative embodiments, the connector 760 may be provided at an offset location on the receiving substrate 740.

In this example embodiment, the connector 760 may be provided on the outer surface of the second substrate body 747. In alternative embodiments, the connector may provided on the lower surface of a first substrate body. Additionally, the connector may be oriented other than parallel to the slot. For example, the connector may be oriented perpendicular to the slot.

The stack package 700 may be installed by inserting the connector 760 into a socket mounted on a motherboard, such as a semiconductor module and/or a video card (for example).

While example embodiments have been described, it will be understood that the invention is not limited to the disclosed embodiments, but is intended to cover various modifications and equivalent arrangements included within the spirit and scope of the appended claims.

What is claimed is:

1. A package comprising:
   a receiving substrate having slots provided at vertical intervals, substrate pads provided on a wall of the slots, and openings corresponding to the slots, the receiving substrate includes:
   a substrate body having a loading space and slots on two confronting inner surfaces that define the loading space; and
   a circuit wiring layer formed on the substrate body and including the substrate pads, terminal pads provided on an outer surface of the substrate body, and an inner wiring layer electrically connecting the substrate pads to the terminal pads,
   wherein the substrate body includes:
   a first substrate body having a lower surface supporting a wiring layer with the terminal pads;
   a pair of second substrate bodies stacked facing each other at opposite sides of the upper surface of the first substrate body and provided with the and
   a third substrate body stacked on the second substrate bodies,
   wherein the substrate body is an integral body composed of the first substrate body, the pair of second substrate bodies and the third substrate body; and
   a unit package having a plurality of connecting pads provided on one surface, the unit package being horizontally insertable into the slots through the openings, such that the connecting pads are electrically connected to the substrate pads by mechanical contact, and the unit package being horizontally removable from the slots through the opening to be replaced with another unit package without disassembling the receiving substrate,
   wherein the unit package includes:
   a semiconductor chip; and
   a wiring substrate on which the semiconductor chip is mounted, the wiring substrate supporting the connecting pads.

2. The package of claim 1, wherein the inner wiring layer comprises:
   a connecting pattern extended from the substrate pads provided on each slot; and
   a via connecting the connecting patterns to each other and connecting to the lower wiring layer of the first substrate body.

3. The package of claim 1, wherein the terminal pads are provided at an outer surface adjacent to the surface in which the slots are provided and the inner wiring layer includes a via electrically connecting the substrate pads to the terminal pads.

4. The package of claim 1, wherein conductive bumps are provided on the terminal pads.

5. The package of claim 1, wherein a connector protrudes from an outer surface of the substrate body, and the terminal pads are formed on the outer surface of the connector.

6. The package of claim 5, wherein the connector is provided on the outer surface of the substrate body having the slots.

7. The package of claim 1, wherein the distance between the vertically adjacent slots is greater than the thickness of the unit package.

8. The package of claim 1, wherein the wiring substrate further includes a resin sealing that seals the semiconductor chip.

9. The package of claim 8, wherein the wiring substrate is a printed circuit board.

10. The package of claim 1, wherein a resin sealing covers the entire surface of the wiring substrate on which the semiconductor chip is mounted, the connecting pads are provided on another surface of the wiring substrate, and the resin sealing and the wiring substrate are inserted into the slot of the receiving substrate.

11. The package of claim 10, wherein the wiring substrate is one of a printed circuit board and a tape wiring substrate.

12. The package of claim 1, wherein the semiconductor chip is flip chip bonded to the wiring substrate.

13. The package of claim 1, wherein the unit package includes more than one semiconductor chip.

14. A semiconductor module including:
 a module substrate;
 a plurality of the packages of claim 2 fixed on at least one surface of the module substrate by conductive bumps of the packages.

15. The semiconductor module of claim 14, wherein the conductive bumps are solder balls.

16. The package of claim 1, wherein the connecting pads have a lower surface substantially flush with an lower surface of the wiring substrate.

17. The package of claim 1, wherein the wiring substrate comprises:
 a center region on which the semiconductor chip is mounted; and
 edge regions supporting the connecting pads, the edge regions being inserted into the slots.

18. The package of claim 1, wherein the wiring substrate is a hard substrate.

19. A package comprising:
 a receiving substrate having slots provided at vertical intervals, substrate pads provided on a wall of the slots, and openings corresponding to the slots, the receiving substrate includes:
  a substrate body having a loading space and slots on two confronting inner surfaces that define the loading space; and
  a circuit wiring layer formed on the substrate body and including the substrate pads, terminal pads provided on an outer surface of the substrate body, and an inner wiring layer electrically connecting the substrate pads to the terminal pads,
  wherein the inner wiring layer includes:
   a connecting pattern extended from the substrate pads provided on each slot; and
   a via connecting the connecting patterns to each other and connecting to the lower wiring layer of the first substrate body, and
 a unit package having a plurality of connecting pads provided on one surface, the unit package being horizontally insertable into the slots through the openings, such that the connecting pads are electrically connected to the substrate pads by mechanical contact, and the unit package being horizontally removable from the slots through the opening to be replaced with another unit package without disassembling the receiving substrate,
 wherein the unit package includes:
  a semiconductor chip; and
  a wiring substrate on which the semiconductor chip is mounted, the wiring substrate supporting the connecting pads.

* * * * *